(12) United States Patent
Yamagishi

(10) Patent No.: US 10,298,729 B2
(45) Date of Patent: May 21, 2019

(54) CONNECTOR AND METHOD OF MANUFACTURING THE SAME

(71) Applicant: FUJIKURA LTD., Kohtoh-ku, Tokyo (JP)

(72) Inventor: Hiroyuki Yamagishi, Tokyo (JP)

(73) Assignee: FUJIKURA, LTD., Kohtoh-Ku, Tokyo (JP)

( * ) Notice: Subject to any disclaimer, the term of this patent is extended or adjusted under 35 U.S.C. 154(b) by 0 days.

(21) Appl. No.: 15/724,548

(22) Filed: Oct. 4, 2017

(65) Prior Publication Data

US 2018/0103133 A1 Apr. 12, 2018

(30) Foreign Application Priority Data

Oct. 11, 2016 (JP) .................................. 2016-200082

(51) Int. Cl.

| | |
|---|---|
| *H04M 1/02* | (2006.01) |
| *B29C 45/14* | (2006.01) |
| *B29C 45/33* | (2006.01) |
| *B29C 51/12* | (2006.01) |
| *H01R 13/52* | (2006.01) |
| *H05K 7/14* | (2006.01) |
| *B29C 65/16* | (2006.01) |
| *H01R 13/504* | (2006.01) |
| *B29L 31/36* | (2006.01) |
| *H01R 12/72* | (2011.01) |

(52) U.S. Cl.
CPC ....... *H04M 1/0274* (2013.01); *B29C 45/1418* (2013.01); *B29C 45/332* (2013.01); *B29C 51/12* (2013.01); *B29C 65/16* (2013.01); *H01R 13/504* (2013.01); *H01R 13/521* (2013.01); *H01R 13/5213* (2013.01); *H05K 7/1427* (2013.01); *B29L 2031/36* (2013.01); *H01R 12/725* (2013.01)

(58) Field of Classification Search
CPC ............. H04M 1/0274; H01R 13/5202; H01R 13/5205
USPC .................................................. 439/589, 736
See application file for complete search history.

(56) References Cited

U.S. PATENT DOCUMENTS 4,566,748 A * 1/1986 Tanishi ................ H01R 4/4818
439/441
4,731,925 A * 3/1988 Tanishi ................ H01R 13/745
200/296

(Continued)

FOREIGN PATENT DOCUMENTS

| CN | 1715030 A | 1/2006 |
|---|---|---|
| CN | 103228392 A | 7/2013 |

(Continued)

OTHER PUBLICATIONS

Japanese Office Action dated Feb. 14, 2018 for corresponding Japanese Application No. 2016-200082, 7 pages.
Office Action for related CN App No: 201710903507.1 dated Dec. 12, 2018, 9 pgs.

*Primary Examiner* — Tulsidas C Patel
*Assistant Examiner* — Peter G Leigh
(74) *Attorney, Agent, or Firm* — Procopio, Cory, Hargreaves & Savitch LLP

(57) ABSTRACT

A connector is formed by fixing two or more connector parts each made from a resin to each other by press fitting or with an adhesive. At least one weld part regulating thermal deformation between the connector parts is formed in a boundary portion between the adjoining connector parts.

4 Claims, 7 Drawing Sheets

(56) References Cited

U.S. PATENT DOCUMENTS

| | | | | |
|---|---|---|---|---|
| 5,770,818 A | * | 6/1998 | Tanaka | B60R 16/027 |
| | | | | 174/84 R |
| 6,957,981 B2 | * | 10/2005 | Karino | H01R 13/5845 |
| | | | | 439/606 |
| 7,220,063 B2 | * | 5/2007 | Chung | G02B 6/3636 |
| | | | | 385/88 |
| 8,241,073 B2 | * | 8/2012 | Hemmi | H01R 13/41 |
| | | | | 439/752 |
| 2010/0052213 A1 | | 3/2010 | Oohashi et al. | |
| 2010/0255732 A1 | * | 10/2010 | Kohmura | B29C 45/006 |
| | | | | 439/733.1 |
| 2014/0147693 A1 | * | 5/2014 | Yasuyama | B32B 3/00 |
| | | | | 29/428 |

FOREIGN PATENT DOCUMENTS

| | | | | | |
|---|---|---|---|---|---|
| JP | 52144793 | A | | 12/1977 | |
| JP | 6247981 | A | | 3/1987 | |
| JP | 6247981 | A1 | * | 3/1987 | ......... H01R 13/5202 |
| JP | 04167384 | A | | 6/1992 | |
| JP | 05114503 | A | | 5/1993 | |
| JP | H06254902 | A | | 9/1994 | |
| JP | 2005063933 | A | | 3/2005 | |

\* cited by examiner (a)

(b)

CONNECTOR AND METHOD OF MANUFACTURING THE SAME

TECHNICAL FIELD

This invention relates to a connector and a method of manufacturing the same, and more particularly to a connector formed by fixing two or more connector parts each made from a resin by press fitting or with an adhesive.

RELATED ART

Recent electronic devices are advanced thinning rapidly. It is largely demanded to make a connector thin and small in association therewith. In order to meet such a demand, assemble structures are well applied such that a plurality of connector parts manufactured in advance as modules are assembled and integrated. For example, an insert part embedding a part of terminals each made from a conductive metal therein as a connector part is assembled and integrally united with a housing separately prepared as another connector part.

In case of joining two or more connector parts each made from a resin, these connector parts are fixed by press fitting, or by loose fitting in which each of the connector parts is formed to a size for loose fitting and an adhesive is applied to a gap between the mutual parts to fix them. For instance, FIG. 6 of Patent Document 1 discloses a method of manufacturing a female connector in which a mold part is formed so as to partially embed terminals and fitted into a separately prepared and frame-shaped mold part.

PATENT DOCUMENT

Patent Document 1: JP-A-H06-254902

SUMMARY OF THE INVENTION

However, when the thus assembled connector is heated at subsequent adhesive-drying step or reflow step, it may be deformed by heat. In recent years, since the rigidity of the connector is decreased in association with thinning and downsizing and also the heating temperature is rising in connection with using of lead-free solders, the deformation due to the heat is increasing.

When the two or more connector parts are fixed by press fitting, these parts are exposed to an environment of a higher temperature such as 250° C. in the reflow step and relatively subjected to thermal deformation, whereby position shifting between mutual fixed parts or torsion of the connector is caused.

On the other hand, when the parts are assembled by loose fitting, the adhesive therebetween is selected so as to have a heat resistance because it is required to withstand to a temperature of 250° C. in the reflow step, and hence an epoxy adhesive is used. As the epoxy adhesive are included a thermosetting type curing at about 150° C. and a two-pack chemical reaction type. Even in the both types, volume expansion and shrinkage of the adhesive itself are caused to bring about the deformation of the connector. The thermosetting adhesive has a property that the volume is expanded and the viscosity is decreased as the temperature rises, so that the connector is deformed until the thermosetting adhesive reaches to the curing temperature and the adhesive is easily leaked out from the deformed site and solidified to cause problems related to performances and appearance of the connector.

Since the two or more connector parts fixed by press fitting or with the adhesive are thermally expanded to deform the connector as a whole under the higher-temperature environment, the connector would be mounted at a state of the relative position between the mutual fixed parts shifts or at a state of the connector twists. These cause mounting defects.

It is, therefore, an object of the invention to provide a connector and a method of manufacturing the same capable of preventing poor mounting due to thermal deformation after the assembling and improving a reliability of the connector.

The invention is concerned to a connector having two or more connector parts each made from a resin to each other, which are fixed each other by press fitting or with an adhesive, wherein at least one weld part regulating thermal deformation between the connector parts is formed in a boundary portion between the adjoining connector parts.

In the connector according to the invention, the weld part is preferable to be formed linearly.

In this case, it is preferable that a recessed cavity or an opening portion is formed in one connector part among the adjoining connector parts and the other connector part is housed and disposed in the recessed cavity or the opening portion, whereby the boundary portion is extended circularly and the linear weld part is formed over a full circumference of the circular boundary zone.

Alternatively, the weld part is preferable to be formed in a dotshape.

In this case, it is preferable to provide more than one weld parts with the dot shape, wherein the weld parts are disposed at a predetermined interval.

Furthermore, it is preferable that the connector is provided with a plurality of contacts each made from an electrically conductive metal and the weld part with the dot shape is formed between the contacts.

The invention is concerned with a method of manufacturing a connector, which comprises steps of fixing two or more connector parts each made from a resin to each other by press fitting, and irradiating a laser beam to a boundary portion between adjoining connector parts to form at least one weld part regulating thermal deformation of the connector parts.

The invention is also concerned with a method of manufacturing a connector, which comprises steps of interposing an adhesive between two or more connector parts each made from a resin, and irradiating a laser beam to a boundary portion between adjoining connector parts to form at least one weld part regulating thermal deformation of the connector parts.

In the manufacturing method of the connector according to the invention, the weld part is preferable to be formed linearly.

In this case, it is preferable that a recessed cavity or an opening portion is formed in one connector part among the adjoining connector parts and the other connector part is housed and disposed in the recessed cavity or the opening portion, whereby the boundary portion is extended circularly and the linear weld part is formed over a full circumference of the circular boundary zone.

Alternatively, the weld part is preferable to be formed in a dotshape.

In this case, it is preferable to dispose the weld parts with the dot shape at a predetermined interval.

Furthermore, it is preferable that the connector is provided with a plurality of contacts each made from an electrically conductive metal and the weld part with the dot shape is formed between the contacts.

Moreover, the contact is preferable to be made from a metal hardly fusing to the laser beam irradiated in the formation of the weld part as compared to the connector part, or it is preferable that an electrically conductive metal layer hardly fusing to the laser beam in the formation of the weld part as compared to the connector part is disposed on the surface of the contact. For example, as the material of the electrically conductive metal or the electrically conductive metal layer for the connector can be used a material having a lower absorption rate to the laser beam, a material having a higher melting point, or a material having a lower absorption rate to the laser beam and a higher melting point as compared to the resin material for the connector part.

In the connector according to the invention, when the heating is performed at 150° C. in the adhesive-drying step after the assembling or the heating is performed at 250° C. in the reflow step, the connector parts tend to be thermally deformed (thermally expanded), but the adjoining connector parts are joined to each other through the weld part to mutually regulate thermal deformation, and hence the position shifting between the mutual connector parts or torsion of the connector can be prevented and the leakage of the adhesive from the boundary portion between the adjoining connector parts can be prevented to provide an excellent mounting precision.

In the manufacturing method of the connector according to the invention, a connector having an improved reliability can be manufactured easily while preventing poor mounting due to the thermal deformation after the assembling.

EMBODIMENTS FOR CARRYING OUT THE INVENTION

Figure 1:
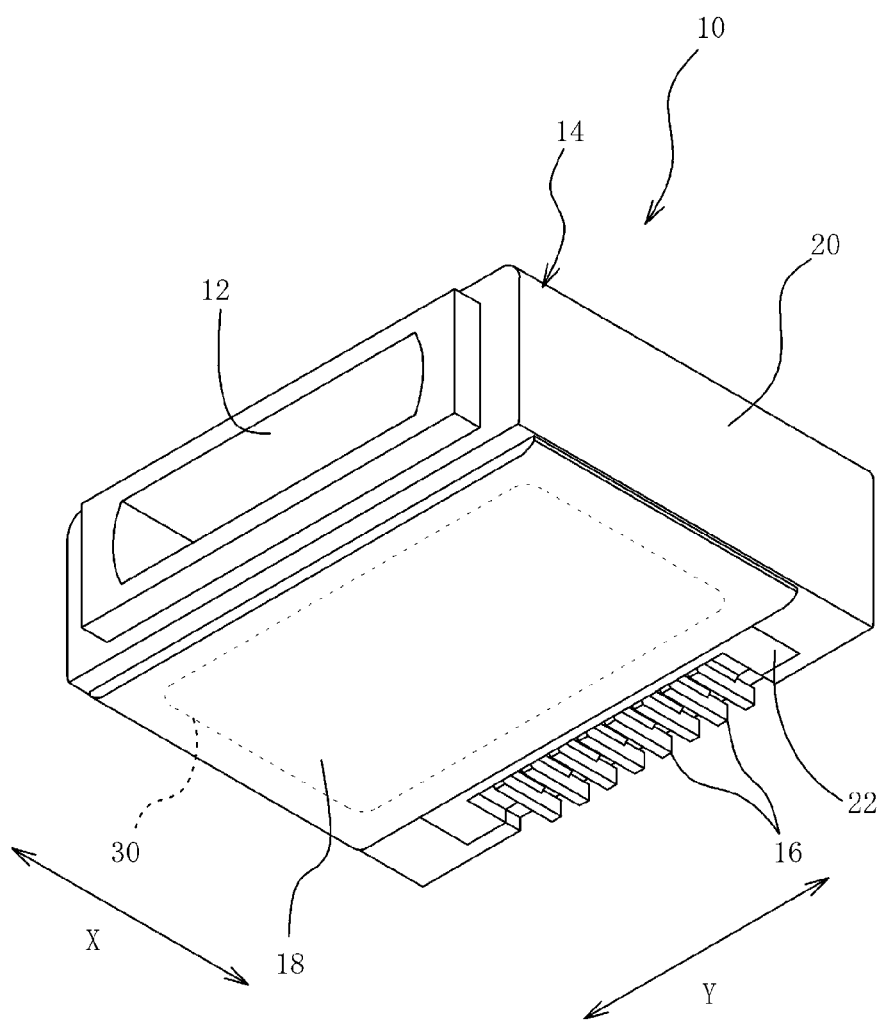
FIG. 1 is a perspective view of a connector according to the invention viewing from a bottom side thereof.
Figure 2:
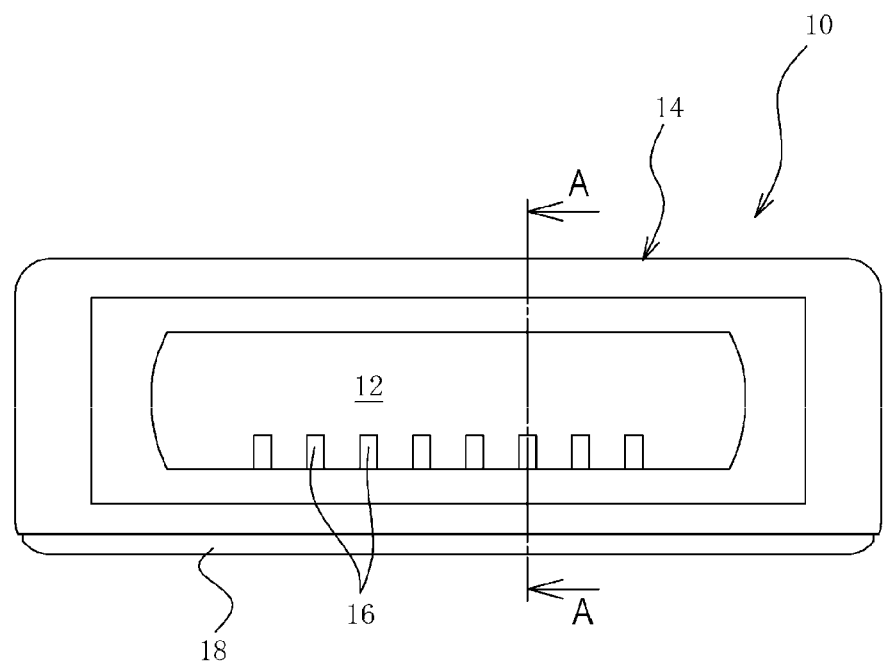
FIG. 2 is a front view of the connector shown in FIG. 1.
Figure 3:
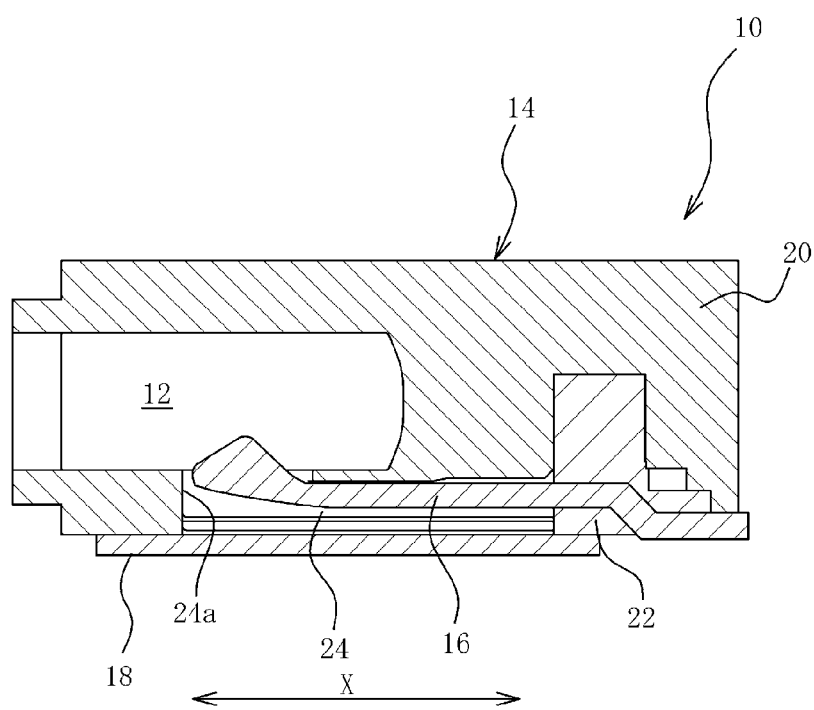
FIG. 3 is a section view taken along a line A-A of FIG. 2.
Figure 4:
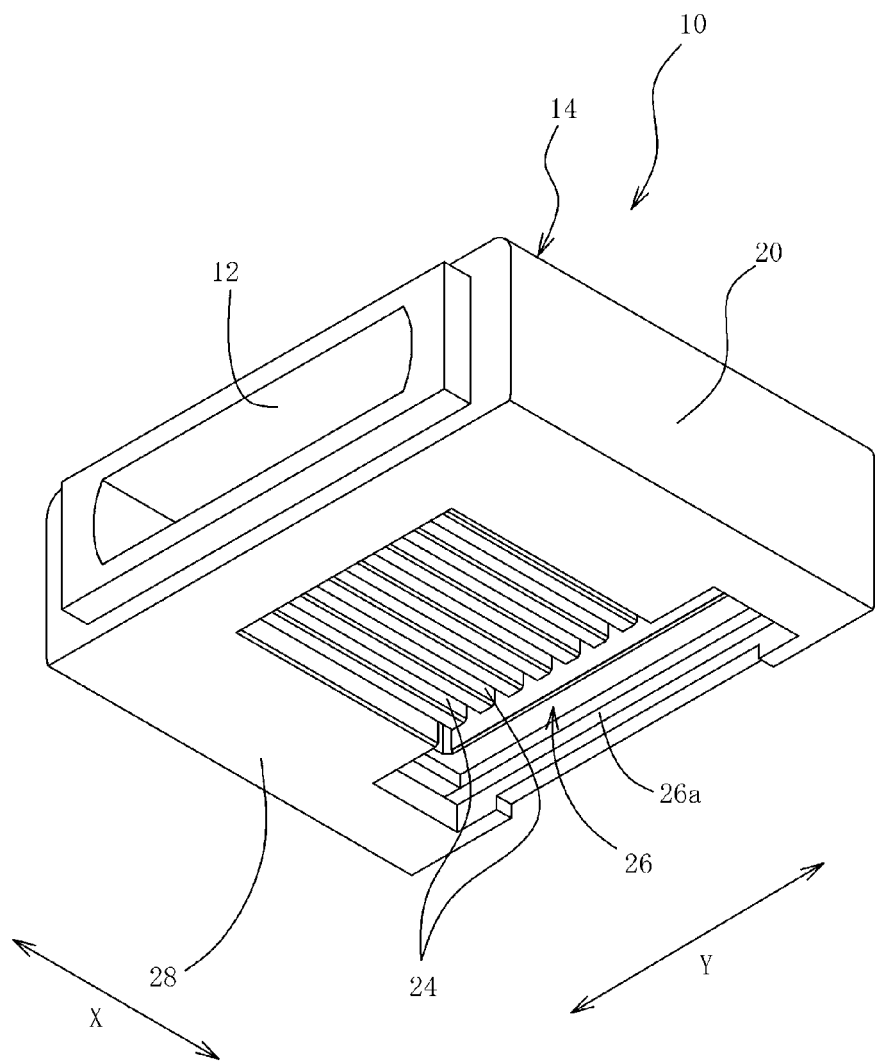
FIG. 4 is a perspective view of a main housing body before the assembling of an insulating resin body viewing from a bottom side in the connector of FIG. 1.

Embodiments of the invention will be described in detail with reference to the accompanying drawings below. Here, FIG. 1 is a perspective view of a connector of an embodiment according to the invention. FIG. 2 is a front view of the connector of FIG. 1. FIG. 3 is a section view taken along a line A-A in FIG. 2. FIG. 4 is a perspective view of a main housing body viewing from a bottom side of the connector in FIG. 1 before the assembling of an insulating resin body.

A connector 10 shown in FIGS. 1 and 2 is a receptacle connector to be mounted to a substrate in an electronic device such as mobile device, information device or the like and connected to the other connector inserting along a fitting direction X. The connector 10 is comprised mainly of a housing 14 provided at a front side with a fitting port 12 for connecting to the other connector, a plurality of elongated contacts 16 each exposing at a front end side to the fitting port 12 for contacting with a respective contact of the other connector and at a rear end side to an outside of the housing 14 for connecting to the substrate, and a cover 18 disposed in the bottom side of the housing 14.

As shown in FIG. 3, the housing 14 comprises a main housing body 20 as a connector part defining the fitting port 12, and an insulating resin body 22 as the other connector part. Each of the main housing body and the insulating resin body is made from an insulating resin material. As the insulating resin material are mentioned polyamide resin, polyethylene resin, polypropylene resin, polyethylene terephthalate resin, polybutylene terephthalate resin, polyphenyl ether resin, polystyrene resin, high-impact polystyrene resin, hydrogenated polystyrene resin, polyacrylstyrene resin, ABS resin, AS resin, AES resin, ASA resin, SMA resin, polyalkyl methacrylate resin, polymethyl methacrylate resin, polycarbonate resin, polyester resin, polyphenylene sulfide, liquid crystal polymer, styrene-based thermoplastic elastomer, olefinic thermoplastic elastomer, polyester-based thermoplastic elastomer, polyurethane-based thermoplastic elastomer, PVC-based thermoplastic elastomer and so on. The insulating resin material may be kneaded with glass fibers, minerals or the like as a reinforcing material.

The main housing body 20, as shown in FIG. 4 at a state before the assembling of the insulating resin body 22 and the contacts 16, is provided at the bottom side with a plurality of groove portions 24 extending along a fitting direction X for receiving the contacts 16 and a recessed cavity 26 communicating with a rear end portion of the groove portion 24 and extending along a direction Y intersecting to the fitting direction X for receiving the insulating resin body 22.

Each of the groove portions 24 has a width and a length corresponding to a width and a length of the contact 16 to be received and is provided in the front end portion with an opening hole 24a for exposing a contact portion of the contact 16 in the fitting port 12 (see FIG. 3). Also, it is preferable to leave margin areas 28 at a front side and right and left sides of a zone of the groove portions 24 for joining the cover 18. A margin area at a rear side of the zone of the groove portions 24 is formed on a bottom face of the insulating resin body 22 which is to be disposed in the recessed cavity 26 of the main housing body 20.

The recessed cavity 26 is extended in the intersecting direction Y over the zone of the groove portions 24. The recessed cavity 26 is provided in its interior with a step part 26a decreasing a width (length in the fitting direction X) and a length (length in the intersecting direction Y) of the recessed cavity 26, which is constructed so as to contact with an upper face of a flange portion 22a of the insulating resin body 22.

Figure 5:
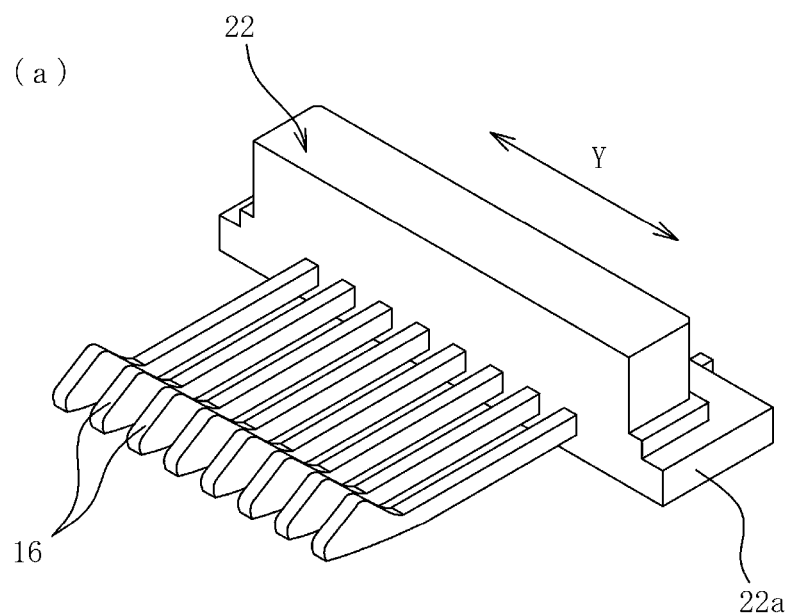
FIG. 5 shows an insulating resin body partially embedding contacts in the connector of FIG. 1, wherein (a) is a perspective view viewing from a top side and (b) is a perspective view viewing from a bottom side.
Figure 5:
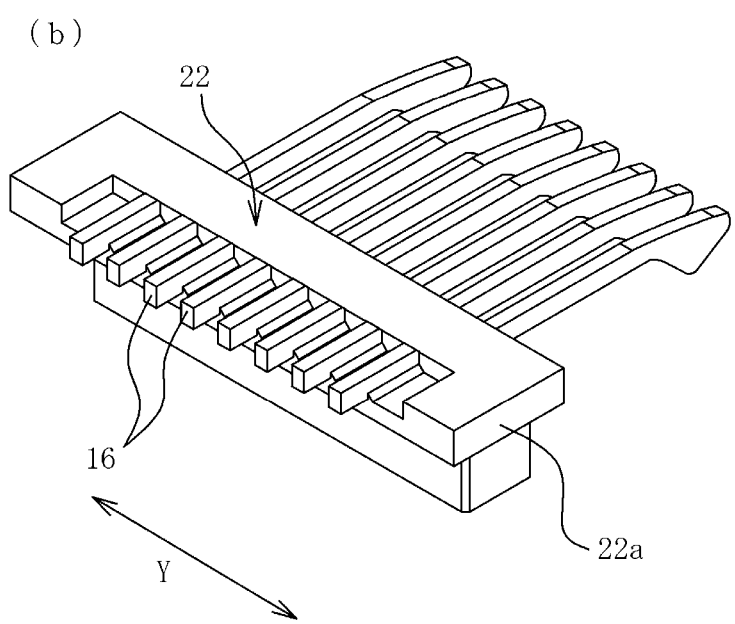

The insulating resin body 22, as shown in FIGS. 5(a) and (b) at a state before the assembling to the main housing body 20, is formed along the intersecting direction Y and intermediate part between the front end and the rear end of each contact 16 is embedded and held therein. The flange portion 22a is formed at the side of the bottom face of the insulating resin body 22 so as to contact with the lower face of the step part 26a formed in the recessed cavity 26 of the main housing body 20.

As shown in FIG. 3, the insulating resin body 22 is loosely fitted or press into the recessed cavity 26 of the main housing body 20. When the insulating resin body 22 is loosely fitted into the recessed cavity 26, an adhesive is interposed into a gap therebetween to fix them. As the adhesive can be used a thermosetting type adhesive which is cured by heating, a dry-setting type adhesive, a two-pack reaction type adhesive, a light-setting type adhesive and so on. As an example of preferable adhesives may be mentioned a thermosetting type epoxy adhesive.

As shown in FIGS. 1 and 3, the cover 18 is made from a thermoplastic resin or a thermoplastic elastomer and shaped into a thin plate. As a material of the cover 18 are included, for example, polyamide resin, polyethylene resin, polypropylene resin, polyethylene terephthalate resin, polybutylene terephthalate resin, polyphenyl ether resin, polystyrene resin, high-impact polystyrene resin, hydrogenated polystyrene resin, polyacryl styrene resin, ABS resin, AS resin, AES resin, ASA resin, SMA resin, polyalkyl methacrylate resin, polymethyl methacrylate resin, polycarbonate resin, polyester resin, polyphenylene sulfide, liquid crystal polymer, styrene-based thermoplastic elastomer, olefinic thermoplastic elastomer, polyester-based thermoplastic elastomer, polyurethane-based thermoplastic elastomer, PVC-based thermoplastic elastomer and so on, which may be kneaded with glass fibers, minerals or the like as a reinforcing material.

The cover 18 may be joined to the margin areas 28 of the bottom face of the housing 14 by a laser transmission welding process. In this process, the cover 18 is preferable to be formed so as to have an absorption rate to a laser beam lower than that of the housing 14 (main housing body 20 and insulating resin body 22). Thus, the laser beam is irradiated to a boundary face between the cover 18 and the housing 14 from the side of the cover 18 to form a weld part 30 in the boundary face or in the vicinity thereof, whereby the cover 18 can be joined to the housing 14. Moreover, the weld part 30 is preferable to be formed in a circle enclosing all the groove portions 24 as a whole for blocking communication between the interior of the fitting port 12 and the outside of the housing 14 through the groove portion 24 to ensure waterproofing property.

Figure 6:
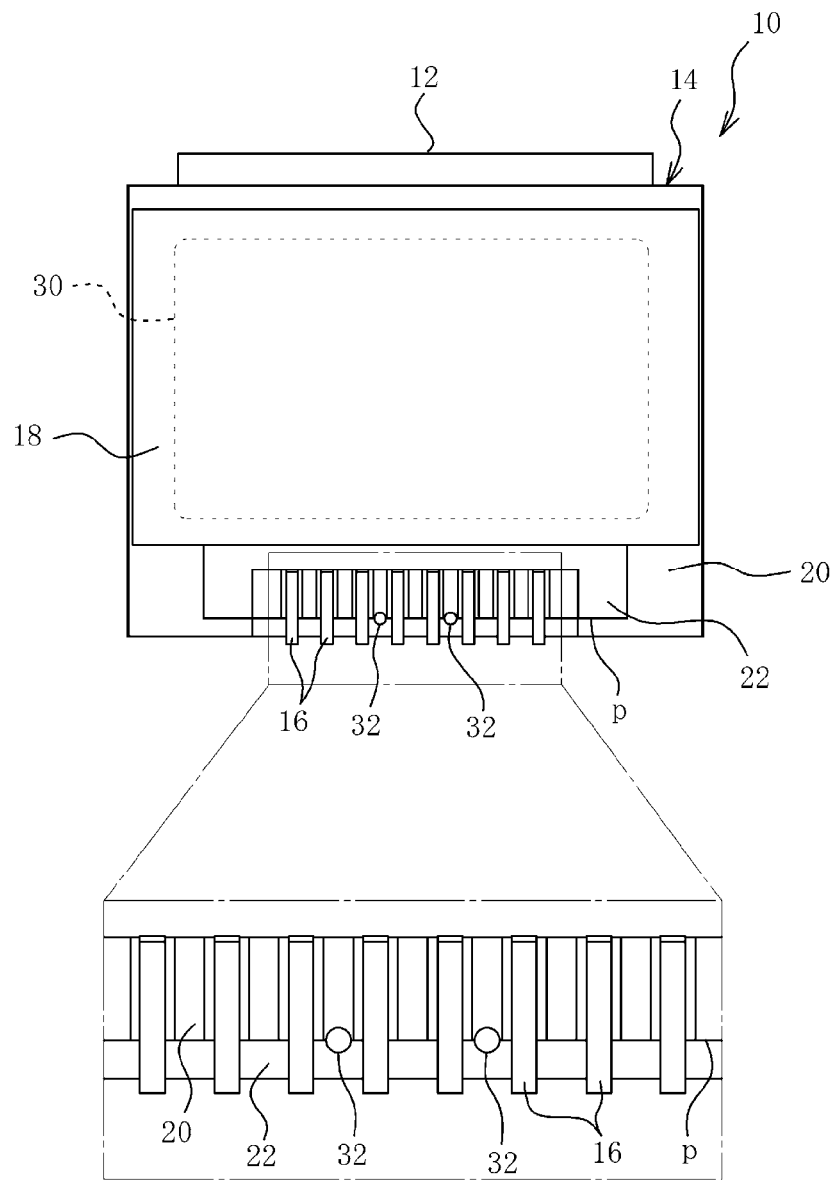
FIG. 6 is a bottom view of the connector of FIG. 1.

FIG. 6 shows a bottom face side of the connector 10. At least one weld part 32 (two parts in the illustrated example) joining the insulating resin body 22 and the main housing body 20 to regulate (constrain) thermal deformation is formed in a boundary portion p between adjoining connector parts or in the boundary portion p between the edge of the insulating resin body 22 and the main housing body 20. The weld part 32 can be formed, for example, by laser beam irradiation.

When the connector 10 having above-mentioned structure is heated to 150° C. at the adhesive-drying step or to 250° C. at the reflow step after the assembling, the insulating resin body 22 and the main housing body 20 are liable to cause thermal deformation (thermal expansion), but the thermal deformation is mutually regulated through the weld part 32 joining the insulating resin body 22 and the main housing body 20. As a result, the position shifting between the mutual insulating resin body 22 and the main housing body 20 or the torsion of the connector 10 can be prevented and also the leakage of the adhesive from the boundary portion p between the insulating resin body 22 and the main housing body 20 can be prevented to obtain an excellent mounting precision.

In the illustrated example, each of the weld part 32 a dot shape and is formed between rear end portions of the adjoining contacts 16. However, the weld part 32 may be formed linearly when the contacts 16 are arranged so as not to interfere with the boundary portion p. Even when the weld part 32 has the dot shape, since the insulating resin body 22 contacts face to face with the main housing body 20, the leakage of the adhesive can be prevented by the contacting faces as sealing faces. When the weld part 32 is formed linearly, the sealing area can be enlarged to enhance the effect of preventing the leakage of the adhesive. In order to more enhance the effect of preventing the leakage, the weld part 32 may be formed continuously over the whole circumference of the boundary portion p. If the mutual parts to be joined by the weld part 32 are not existent in the same plane or there is a fear of causing thermal deformation of the connector parts in the laser beam irradiation process, it is preferable to form the weld parts 32 in the dot shape to reduce thermal load. Alternatively, it is also possible to temporarily weld the insulating resin body 22 and the main housing body 20 in a dot pattern by laser beams so as to regulate deformation and thereafter form a continuous weld part 32 over the whole circumference thereof. In case of forming the dot-like weld part, since thermal deformation in the adhesive-drying step or the reflow step after the assembling is linear expansion, it is preferable to form the weld part in a central portion of the boundary portion p being larger in the deformation (between corner portions) instead of a corner portion joining two sides thereof from a viewpoint of regulating the deformation effectively.

The method of manufacturing the connector according to the invention will be described below. Here, the method of manufacturing the connector 10 shown in FIGS. 1-6 is explained as an example.

The first step is a step of providing parts. In this step are provided a main housing body 20 having a fitting port 12, a groove portion 24 and a recessed cavity 26 and an insulating resin body 22 embedded with a plurality of contacts 16. The main housing body 20 can be produced by injection molding or the like with the aforementioned insulating resin material. The insulating resin body 22 can be manufactured by arranging the plural contacts 16 along the same direction (fitting direction X) and at predetermined intervals in an intersecting direction Y, using these contacts 16 as insert members and inserting and shaping an insulating resin material around each intermediate portion between the front end and rear end of the contact 16.

The second step is a step of arranging the parts, in which the insulating resin body 22 is arranged in the recessed cavity 26 of the main housing body 20 and the contacts 16 held by the insulating resin body 22 are inserted into the respective groove portions 24. The insulating resin body 22 is fitted under a pressure, or loosely fitted into the recessed cavity 26 of the main housing body 20 and an adhesive is interposed into a gap between the recessed cavity 26 and the insulating resin body 22. The adhesive can be previously applied to the recessed cavity 26 of the main housing body 20 or the outer face of the insulating resin body 22 or both thereof.

The third step is a step of forming (a) weld parts, in which a laser beam is irradiated to a boundary portion p between the edge of the insulating resin body 22 and the main housing body 20 to form (a) weld parts 32. As the irradiated laser beam are mentioned, for example, carbon dioxide laser (wavelength: about 10600 nm), Nd:YAG laser (wavelength: about 1064 nm), green laser as a secondary harmonic of Nd:YVO4 laser (wavelength: about 532 nm), diode laser (wavelength: about 800 nm, 840 nm or 950 nm), excimer laser (wavelength: about 193 nm) and so on.

Figure 7:
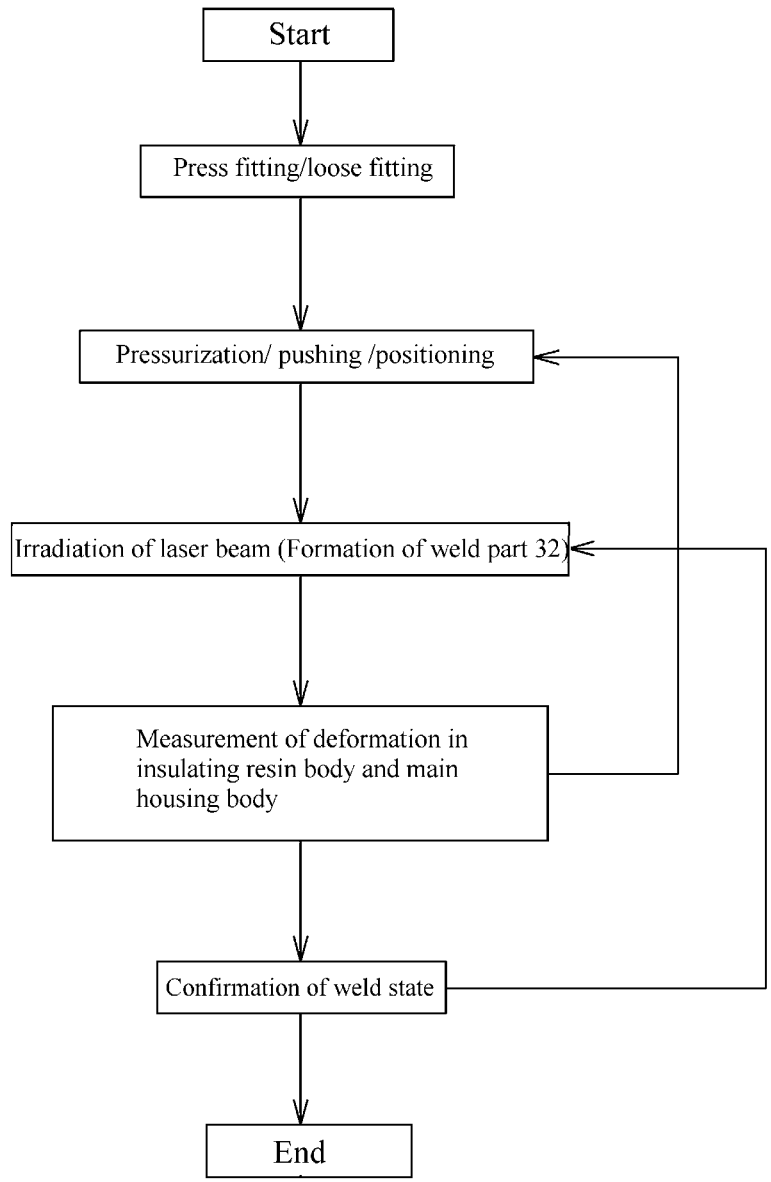
FIG. 7 is a flow chart showing a weld process in a method of manufacturing a connector according to the invention.

In FIG. 7 is shown a flow chard of the welding process, in which the insulating resin body 22 is assembled to the main housing body 20 by press fitting or loose fitting and thereafter these bodies are held and positioned so as not to cause relative position shifting between the insulating resin body 22 and the main housing body 20 in the formation of the weld part 32. Since there is a fear of deforming the shape of the main housing body 20 after the assembling of the insulating resin body 22 by the press fitting, the insulating resin body 22 or the main housing body 20 is held in a certain form by pressurization and then irradiation of the laser beam is performed. The "certain shape" is a shape of reproducing expansion within an acceptable range in the insulating resin body 22 and the main housing body 20 during the heating. The both bodies are welded by laser irradiation while feed-backing a difference between the certain shape and an actual shape to the above positioning and pressurizing process.

When the resin is heated, undesirable gases such as soot, volatile ingredient of a flame retardant and the like are generated. These gases not only contaminate the parts themselves but also shield or scatter laser beams at a gaseous state. If the gas is adhered to a lens for the laser device, poor welding may be caused. To counter this, it is preferable to perform laser welding while blowing air in the vicinity of laser irradiation positions to remove the volatile ingredient in the formation of the weld part 32 with laser irradiation.

When the weld part 32 is formed by the laser irradiation, if the contacts 16 blocking the laser are existent on the boundary portion p between the insulating resin body 22 and the main housing body 20, the laser beam may adversely affect on the contacts 16. Also the molten resin and volatile ingredient may adhere to the contacts 16. In order to avoid such problems, the laser is intermittently irradiated so as to irradiate the laser only between the adjoining contacts 16. Alternatively, in a case of the laser is scanned continuously in a straight line, the contacts 16 are preferably made from a metal hardly fusing to the laser beam as compared to the insulating resin body 22 and the main housing body 20, or an electrically conductive metal layer hardly fusing to the laser beams as compared to the insulating resin body 22 and the main housing body 20 may be arranged on the surface of the contact 16. For example, it is preferable to provide a laser resistant layer such as gold plating that is hardly absorbing the laser beam or a melting point increasing layer such as Cr plating on the surface of the contact 16. With regards to the laser, by using a laser beam having a long wavelength, reducing an output of the laser beam, or raising a scanning speed, the energy density can be adjusted such that the resin parts can be welded but the metal is not reacted.

The fourth step is a step of joining a cover, in which the cover 18 is disposed at the bottom face side of the housing 14 so as to cover the groove portions 24 and joined to the housing 14. The joining is preferable to be performed by a laser transmission welding process. Concretely, the laser beam is irradiated from the side of the cover 18 toward a boundary face between the cover 18 and the housing 14, whereby the boundary face or the vicinity thereof is fused and bonded. The weld part 30 joining the cover 18 and the housing 14 is preferable to be formed in a circular form enclosing the groove portions 24 as a whole. In this case, water proofing property can be applied to the connector 10 by blocking the communication between the fitting port 12 and the outside of the connector 10 through the groove portions 24. The third step and the fourth step may be conducted in reverse order.

According to the method of manufacturing the connector 10 in the above steps, poor mounting due to the thermal deformation after the assembling is prevented, whereby the connector 10 having an improved reliability can be manufactured easily.

Although the above is described with reference to the illustrated examples, the invention is not limited to the aforementioned embodiments and various variations, addition and the like may be performed within a scope described in the claims. For example, two weld parts 32 are formed on the boundary portion p between the insulating resin body 22 and the main housing body 20 in the above embodiment, but the number of the weld part 32 may be one or three or more. In the above embodiment, the insulating resin body 22 is arranged in the recessed cavity 26 at the bottom of the main housing body 20, but an opening portion communicating with the fitting port 12 is formed in the rear of the main housing body 20 and the insulating resin body 22 embedded with the contacts 16 may be fixed to the opening portion by press fitting or by loose fitting with an adhesive.

According to the invention, there can be proved a connector capable of preventing poor mounting due to thermal deformation after the assembling and improving a reliability of the connector and the method of manufacturing the same.

DESCRIPTION OF REFERENCE SYMBOLS

10 connector
12 fitting port
14 housing
16 contact
18 cover
20 main housing body
22 insulating resin body
24 groove portion
26 recessed cavity
28 margin areas
30 circular weld port
32 weld part
p boundary portion

What is claimed is:

1. A connector comprising two or more connector parts, each connector part made from a resin, which are fixed to each other by press fitting or an adhesive, and a plurality of contacts each made from an electrically conductive metal,
   wherein at least one weld part regulating thermal deformation between the connector parts is formed in a boundary portion between the adjoining connector parts,
   wherein said weld part includes at least one dot-shaped weld part which is formed between the contacts.

2. The connector according to claim 1, wherein the weld part includes a linear weld part.

3. The connector according to claim 2, wherein a recessed cavity or an opening portion is formed in one connector part among the adjoining connector parts and the other connector part is housed and disposed in the recessed cavity or the opening portion, whereby the boundary portion is extended circularly and the linear weld part is formed over a full circumference of the circular boundary zone.

4. The connector according to claim 1, comprising more than one dot-shaped weld parts, wherein the dot-shaped weld parts are disposed at a predetermined interval.

\* \* \* \* \*